United States Patent [19]

Todokoro et al.

[11] Patent Number: 4,581,534
[45] Date of Patent: Apr. 8, 1986

[54] IMAGE DISPLAY SYSTEM FOR A STROBOSCOPIC SCANNING ELECTRON MICROSCOPE

[75] Inventors: Hideo Todokoro, Tokyo; Satoru Fukuhara, Kokubunji, both of Japan

[73] Assignee: Hitachi, Ltd., Tokyo, Japan

[21] Appl. No.: 517,818

[22] Filed: Jul. 27, 1983

[30] Foreign Application Priority Data

Aug. 13, 1982 [JP] Japan ................. 57-141511

[51] Int. Cl.⁴ ................. G01N 23/225; H01J 37/28
[52] U.S. Cl. ................. 250/310; 324/158 D
[58] Field of Search ................. 250/310; 324/158 D

[56] References Cited

U.S. PATENT DOCUMENTS 4,486,660 12/1984 Feuerbaum ................. 250/310

OTHER PUBLICATIONS

Taylor, D. M., *J. Phys. D: Appl. Phys.*, vol. 11, 1978, pp. 2443-2454.

*Primary Examiner*—Alfred E. Smith
*Assistant Examiner*—Jack I. Berman
*Attorney, Agent, or Firm*—Antonelli, Terry & Wands

[57] ABSTRACT

This invention relates to an image display system for a stroboscopic scanning electron microscope. In a stroboscopic scanning electron microscope having a pulse gate mechanism for chopping an electron beam and a mechanism for arbitrarily changing the phase relation between a voltage applied to a sample and the chopping, the phase change of chopping is carried out periodically and continuously and a gate circuit provided between a detector for detecting scondary electrons or deflected electrons and an image display for displaying a video signal of the secondary electron or the reflected electron to be in synchronism with the phase change allows the video signal to pass therethrough only during a certain period of phase change and to be displayed.

1 Claim, 17 Drawing Figures

TIME

IMAGE DISPLAY SYSTEM FOR A STROBOSCOPIC SCANNING ELECTRON MICROSCOPE

BACKGROUND OF THE INVENTION

This invention relates to an image display system for a scanning electron microscope, and particularly to an image display system for a stroboscopic scanning electron microscope.

The stroboscopic scanning electron microscope is a scanning electron microscope with a pulse gate and a synchronous circuit added. FIG. 1 shows the basic construction of the stroboscopic scanning electron microscope (refer to G. S. Plows and W. C. Nixon; "Stroboscopic Scanning Electron Microscopy", J. Phys. E., Ser. II, pp 595-600, 1968), and FIGS. 2A and 2B are explanatory diagrams useful for explaining the principle of that microscope. Referring to FIG. 1, an electron beam 2 emitted from an electron gun 1 is focused on a sample 10 to be observed by an electron lens 6 and deflected by a scanning coil or deflector 8 as in the television camera tube. Since the electron beam, when impinging on a solid, is reflected or ejects secondary electrons therefrom, the reflected electrons or secondary electrons are detected by a detector 9, the image from which is displayed on a display 7. The principle of the scanning electron microscope has been described above.

When a sample changing at very high speed is observed by this scanning electron microscope, the scanning and/or the detecting cannot follow the change of the sample, with the result that the total change is displayed in a superimposed manner. For this reasons, a pulse gate (the combination of a deflection plate 3 and an aperture 4) is added which performs chopping of the beam in cooperation with a pulse circuit 12 synchronized with a driver 11 (provided within or out of the sample) which is changing the state of the sample. This construction can control the electron beam irradiating the sample only at a certain phase of the change of the sample, thereby to detect the condition of the sample only at the instant of irradiating the beam.

FIG. 2A is a diagram for explaining this controlling. To better understand this, it is assumed that a point of object is moving at high speed and periodically as A→B→C→B→A within the sample. If the phase of the movement is adjusted by a phase adjuster 5 so that the electron beam is emitted at time a, since the point object is always at position A at time a, it is observed still at position A as shown in FIG. 2B. Similarly, if the phase of the movement is adjusted to point b and c in turn, the point object appears still at B and C. This is the principle under which the high speed object is observed on the stroboscopic scanning electron microscope.

The stroboscopic scanning electron microscope is used mainly for observing the voltage changing at high speed within an LSI. Most of LSI's are covered by a passivation layer. This passivation layer is necessary for the following reasons. That is, when a reverse voltage is applied to a PN junction, a depletion layer which has a strong electric field is caused on the surface. Since this field is subject to the external influence, and the electric characteristics of the PN junction are determined by the parallel connection of the internal bulk and the surface layer, the electric characteristics of the PN junction have a great dependence on the characteristic of the surface layer sensitive to the external conditions and thus are unstable. Therefore, the surface of LSI must be covered by an insulating material (chiefly $SiO_2$), which covered layer is called the passivation layer.

When the LSI covered with a passivation layer is observed on the stroboscopic scanning electron microscope, the low-energy electron beam accelerated by about 1000 V is used to avoid the passivation layer from being electrified by electron beam. In this case, the passivation layer acts as a capacitor because it is an insulating material and is interposed between the electrode to be measured and the electron beam. The presence of this capacitor means that the steady voltage (DC voltage) cannot be observed. Since the stroboscopic system makes the high speed phenomenon steady (i.e. the pulsed electron beam is irradiated on the sample to fix and observe the state of the sample), this situation is the same. Thus, the image of a constant-phase voltage within the LSI covered with the passivation layer could not be fully observed by the stroboscopic scanning electron microscope because the contrast of potential was lost.

SUMMARY OF THE INVENTION

It is an object of this invention to provide an image diplay system for a stroboscopic scanning electron microscope, which is capable is steady observation of a high-speed changing state in the LSI or the like covered by a passivation layer in order to improve the prior art defects.

The feature of this invention is that to achieve the object, the conventional stroboscopic scanning electron microscope is additionally provided with a phase circuit for periodically changing the phase of the pulse for chopping the electron beam relative to a voltage supplied to a sample, and a gate circuit provided between a detector for detecting secondary electrons or reflected electrons and an image display for displaying the video signal of the secondary electrons or the reflected electrons, which gate circuit is synchronized with the phase change by the phase circuit to allow the video signal to pass therethrough only during a certain phase change period and be displayed.

DESCRIPTION OF THE PREFERRED EMBODIMENTS

The basic principle of this invention will first be described.

Figure 3A:
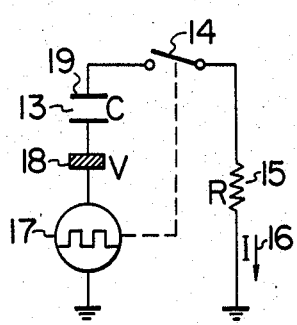
FIGS. 3A to 3C show equivalent model circuits when the LSI covered with a passivation layer is observed by the stroboscopic scanning electron microscope.
Figure 3B:
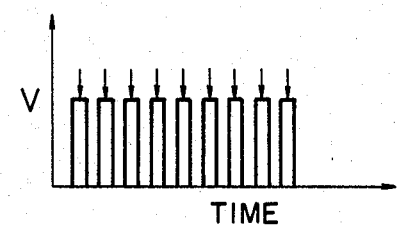
Figure 3C:
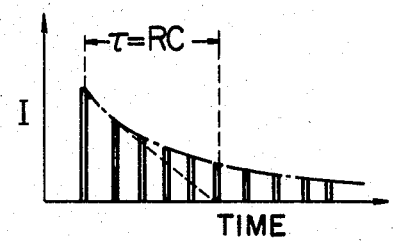

The relation of the capacitor action which is caused by the passivation layer, and the signal produced is shown in the models of FIGS. 3A, 3B and 3C. FIG. 3A shows the model for the relation between the sample and voltage detection, FIG. 3B the model for the phase points for measurement, and FIG. 3C the model for the change of current to be detected with time.

To an electrode 18 within the sample, or LSI is applied a voltage (V) from a high-frequency power supply 17. A switch 14 serves to switch the pulse beam on and off and, when on, allows a current 16 (actually secondary electron current) to flow through a resistor 15 (corresponding to a detection circuit) by which the voltage on the passivation layer is detected. It is assumed that a pulse voltage is applied to the electrode 18 of the LSI, and the switch 14 is turned on only at time indicated by arrows in FIG. 3B. FIG. 3C shows the change of current 16 (I) flowing through the resistor 15, with time. It will be seen from FIG. 3C that the current 16 gradually decreases with time because measurement is made through a capacitor 13 (C). The rate of decrease of current is determined by the time constant RC. Thus, the contrast of potential is lost in the measurement through the passivation layer.

Figure 4A:
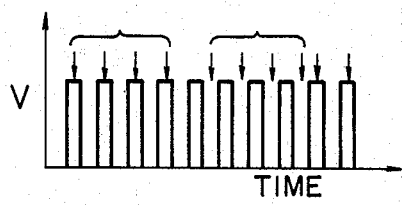
FIGS. 4A and 4B are explanatory diagrams useful for explaining the principle of this invention.
Figure 4B:
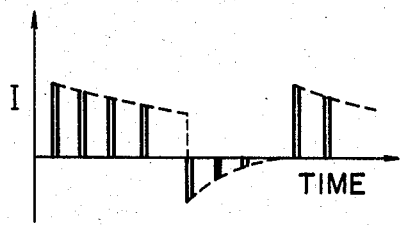

In order to prevent this, it is necessary to change the operation timing of the switch 14 before the current 16 decreases to zero. For example, if as shown in FIG. 4A, the switch 14 is turned on whenever voltage is applied during four cycles and then turned on whenever no voltage is applied during the following four cycles, the change of current with time is as shown in FIG. 4B. In practice, since the phase can be finely adjusted, a continuous wave is obtained. When the period of moving the phase is much shorter than the time constant, the attenuation is almost negligibly small. For example, when the time constant RC is 10 msec, and the period of changing the phase is 0.1 msec, the attenuation is as small as about 1% which can be considered to be completely negligible.

Figure 5:
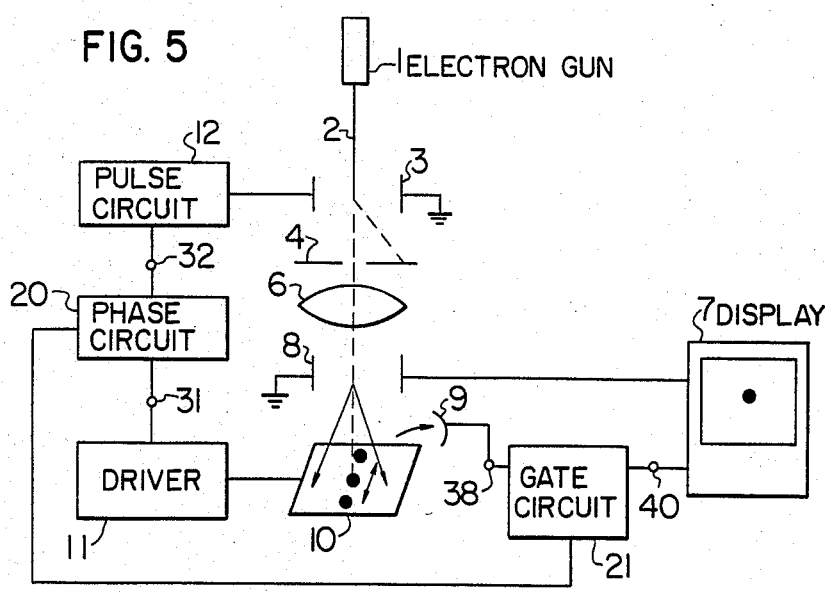
FIG. 5 is a diagram of one embodiment of this invention.

This invention is based on the aforementioned principle. An embodiment of the invention will be described in detail with reference to FIG. 5.

Figure 1:
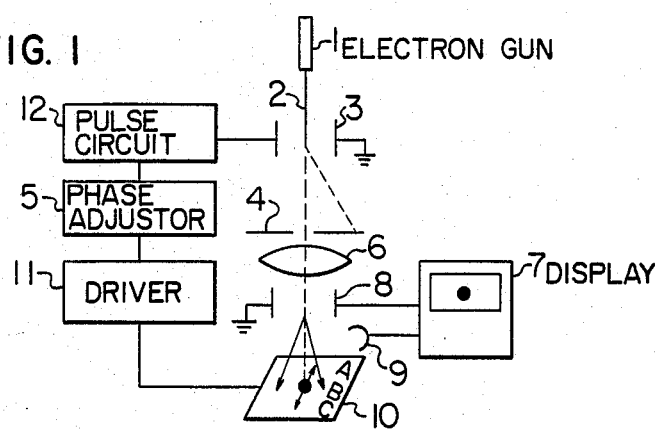
FIG. 1 is a diagram of the basic arrangement of the stroboscopic scanning electron microscope.
Figure 2A:
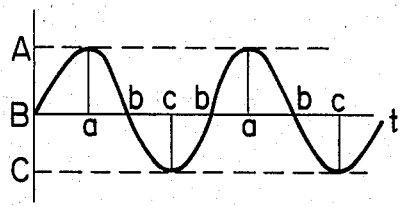
FIGS. 2A and 2B are explanatory diagrams for explaining the principle of the stoboscopic system.
Figure 2B:
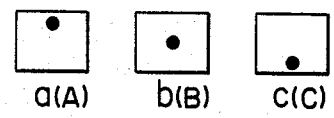
Figure 6A:
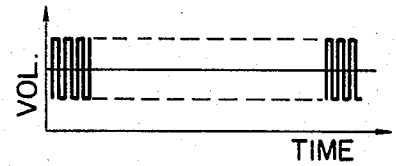
FIGS. 6A to 6C are explanatory diagrams useful for explaining the embodiment of FIG. 5.
Figure 6B:
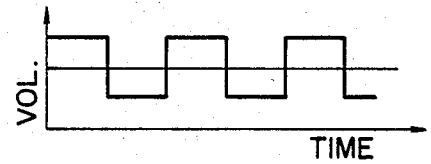

The embodiment of this invention comprises the stroboscopic scanning electron microscope shown in FIG. 1, a phase circuit 20 capable of periodic change of phase and a gate circuit 21 synchronized with this phase circuit 20. FIG. 6A shows the voltage waveform to be applied to the sample, FIG. 6B the waveform detected as a signal, and FIG. 6C the output waveform from the gate circuit 21, showing the relation with FIGS. 6A and 6B. If, now, the sample is supplied with a high frequency of about 1 MHz to 100 MHz as shown in FIG. 6A, the signal to be detected is converted to a relatively low frequency by periodic change of phase circuit 20, for example, 20 kHz to 50 kHz, as shown in FIG. 6B because the phase of the pulse 12 for chopping the electron beam is periodically changed by the phase circuit 20. This wave well reflects the waveform of FIG. 6A.

Figure 6C:
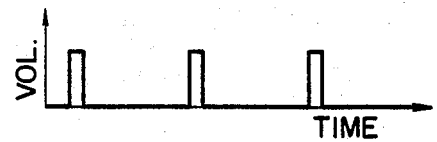

The gate circuit 21 operating in synchronism with the phase circuit 20 passes signals of certain phases of the waveform shown in FIG. 6B, or signals only during the pulses shown in FIG. 6C and supplies the signals to the display. As a result, an image of voltage change under the passivation layer at certain phase points can be displayed in a steady state.

Figure 7:
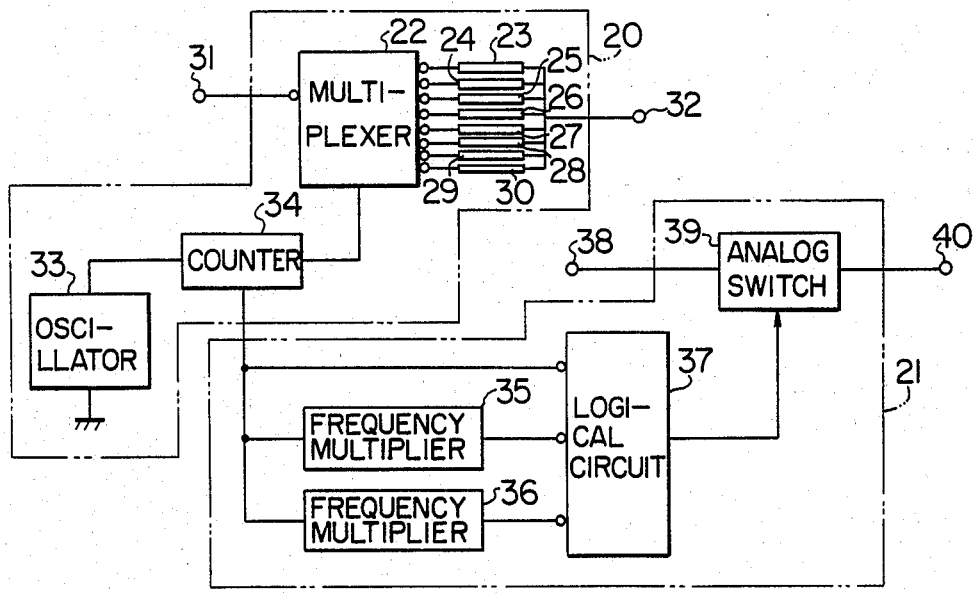
FIG. 7 is a diagram of one example of a specific circuit arrangement of a phase circuit and gate circuit in this invention.

FIG. 7 shows a specific circuit arrangement of the phase circuit 20 and gate circuit 21 used in this embodiment. In FIG. 7, a multiplexer element 22 responds to the output of a counter 34 to supply the input pulse from an input terminal 31 to delay line 23 to 30 in turn. Consequently, at an output end 32 is obtained pulses delayed in turn with respect to the input pulse. Although here, 8 delay lines are shown as an example, it is possible to expand to about 1000 delay lines, for example. The counter 34 is driven by an oscillator 33 which is able to adjust the speed of changing the phase by change of its oscillation frequency.

Figure 8A:
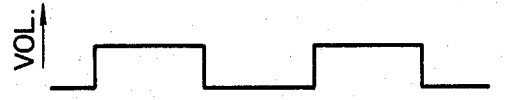
FIGS. 8A to 8D are waveform diagrams useful for explaining the arrangement of FIG. 7.
Figure 8B:
Figure 8C:
Figure 8D:
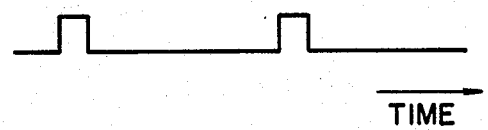

The gate circuit for video signal will be described. The fundamental frequency from the counter 34 is applied to the logical circuit 37, to a two-fold frequency multiplier 35 and to a four-fold frequency multiplier 36, the outputs of the multipliers being applied to the logic circuit 37. The logic circuit 37 produces the logical sum of all the signals, as shown in FIGS. 8A to 8C. FIG. 8A shows the signal of fundamental frequency, FIG. 8B the two-fold frequency signal, and FIG. 8C the four-fold frequency signal. The logical sum of all the signals is shown in FIG. 8D. The signal shown in FIG. 8D makes an analog switch 39 turn on. Thus, during the first ⅛ of the total period, the video signal from a terminal 38 is produced at a terminal 40. By changing the logic, the signal of ⅛ period at any position can be selected.

According to this invention, as described above, since the signal of only a certain period is displayed, the passivation layer problem can be solved and a still picture can be obtained.

Moreover, if a plurality of gate circuits and a display or memory are provided for gradual change of phase in which gates are triggered on, stroboscopic still pictures at different phases can be viewed simultaneously and recorded.

We claim:

1. An image display system for a stroboscopic scanning electron microscope comprising:
    means for generating a pulse for chopping an electron beam emitted from an electron gun;
    means for allowing said chopped electron beam to scan a sample;
    phase circuit means for periodically changing the phase relation between a voltage supplied to said sample and said chopping pulse; and
    gate circuit means provided between a detector for detecting secondary electrons or reflected electrons generated by scanning said electron beam on said sample and image display means for displaying a video signal of the secondary electrons or the reflected electrons, so as to pass said video signal therethrough only during a certain period of phase relation in synchronism with said phase change by said phase circuit means.

* * * * *